United States Patent [19]
Wollesen

[11] Patent Number: 6,020,222
[45] Date of Patent: *Feb. 1, 2000

[54] SILICON OXIDE INSULATOR (SOI) SEMICONDUCTOR HAVING SELECTIVELY LINKED BODY

[75] Inventor: Donald Wollesen, Saratoga, Calif.

[73] Assignee: Advanced Micro Devices, Inc., Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/991,808

[22] Filed: Dec. 16, 1997

[51] Int. Cl.$^7$ .................................................. H01L 21/265
[52] U.S. Cl. ............................................ 438/149; 257/347
[58] Field of Search .................................... 438/149, 227, 438/225, 218, 216, 199, 197; 257/347, 348, 349, 350

[56] References Cited

U.S. PATENT DOCUMENTS

| | | | |
|---|---|---|---|
| 5,463,238 | 10/1995 | Takahashi et al. | 257/351 |
| 5,559,368 | 9/1996 | Hu et al. | 257/369 |
| 5,663,080 | 9/1997 | Cereda et al. | |
| 5,674,760 | 10/1997 | Hong . | |
| 5,767,549 | 6/1998 | Chen et al. | |

FOREIGN PATENT DOCUMENTS

0724295 A1  1/1996  European Pat. Off. .

OTHER PUBLICATIONS

Ben G. Streetman, Solid State Electronic Devices, p 190, 1980.

Shahidi, G.: "SOI: Opportunities and Challenges for Sub–0.25 $\mu$m VLSI" IEEE 1992 Bipolar Circuts and Technology Meeting 13.1 IBM Research division, T. J. Watson Research Center. Yorktown Heights, N. Y., 10598, U.S.A.

Koh, Yo–Hwan et al.: "Body–Contacted SOI MOSFET Structure with Full Bulk CMOS Compatible Layout and Process" IEEE Electron Device Letters, vol. 18., No. 3, Mar. 1997.

Article: Suppression of the SOI Floating–body Effects by Linked–body Device Structure. pp. 92–93. Chen et al. Symposium on VLSI Technology Digest of Technical Papers. IEEE 1996.

*Primary Examiner*—Chandra Chaudhari
*Assistant Examiner*—Martin Sulsky
*Attorney, Agent, or Firm*—LaRiviere, Grubman & Payne, LLP

[57] ABSTRACT

A silicon oxide insulator (SOI) device includes an SOI layer supported on a silicon substrate. A body region is disposed on the SOI layer, and the body region is characterized by a first conductivity type. Source and drain regions are juxtaposed with the body region, with the source and drain regions being characterized by a second conductivity type. A transition region is disposed near the body region above the SOI layer, and the conductivity type of the transition region is established to be the first conductivity type for suppressing floating body effects in the body region and the second conductivity type for isolating the body region. An ohmic connector contacts the transition region and is connected to a drain power supply when the source and drain are doped with N-type dopants. On the other hand, the power supply is a source power supply when the source and drain are doped with P-type dopants. SOI bipolar transistors, pinch resistors, and diodes, all incorporating transition regions, are also disclosed.

17 Claims, 9 Drawing Sheets

SILICON OXIDE INSULATOR (SOI) SEMICONDUCTOR HAVING SELECTIVELY LINKED BODY

TECHNICAL FIELD

The present invention relates generally to semiconductors, and more particularly to methods and structures for rendering SOI-type semiconductors in various configurations.

BACKGROUND OF THE INVENTION

Existing complementary metal oxide silicon (CMOS) semiconductor devices that are produced in mass quantities are referred to as "bulk" CMOS, because they include a semiconductive bulk substrate on which active or passive circuit elements are disposed. Recently, silicon oxide insulator (SOI) devices have been introduced which consume less power than do bulk CMOS devices, an important advantage in many applications such as battery-powered mobile telephones and battery-powered laptop computers. Also, SOI devices advantageously operate at higher speeds than do bulk CMOS devices.

SOI devices are characterized by a thin layer of insulative material (the so-called buried oxide layer, or "SOI") that is sandwiched between a bulk substrate and the circuit elements of the device. Typically, no other layers of material are interposed between the SOI and the bulk substrate. As used herein, the circuit elements establish a circuit component, such as an active transistor or passive component, e.g., a resistor.

In an SOI device, the circuit elements above the SOI are established by regions of field oxide and regions of a monocrystalline semiconductive layer which are doped as appropriate with N-type or P-type conductivity dopants. For example, for an N channel transistor, the isolated silicon layer will include a body region having a P-type dopant, with the body region being disposed between a source region and a drain region, each of which are doped with an N-type dopant, this forming an N channel metal oxide silicon field effect transistor (MOSFET) or a lateral NPN bipolar transistor, for example.

One disadvantage with SOI devices is that the voltage in body region tends to vary, or "float". As noted by Chen et al. in "Suppression of the SOI Floating-body Effects by Linked-body Device Structure", 1996 Symposium on VLSI Technology Digest of Technical Papers (1996 IEEE), consequences of floating body SOI devices include output current kinks, anomalous subthreshold currents, transient current overshoot, and early device breakdown.

Chen et al. propose suppressing the floating body effect by incompletely oxidizing the portion of a silicon layer that field oxidation is grown upon to allow field effect transistor (FET) bodies to be linked together through the unoxidized silicon layer remaining beneath the field oxide. However, Chen et al. do not suggest how to implement their floating body suppression strategy in various component configurations, nor do Chen et al. suggest how to implement their floating body suppression strategy using techniques that can be easily undertaken using existing bulk CMOS fabrication principles. As recognized herein, it is important to enable circuit designers to implement various SOI components using existing bulk CMOS fabrication principles, to promote the use of SOI devices without requiring the reengineering of semiconductor fabrication apparatus and facilities.

Moreover, Chen et al. do not recognize that in some potential SOI circuit component configurations, such as dynamic threshold metal oxide silicon (DTMOS) devices that operate at very low voltages, the floating body effect might be desirable to retain. Indeed, in some circuit element assemblies it might be desirable that some SOI components exhibit floating body characteristics, with the floating body tendency of other SOI components in the assembly being suppressed.

Accordingly, it is an object of the present invention to provide an SOI device in which floating body effects are minimized. Another object of the present invention is to provide an SOI device in which floating body effects can be selectively minimized in some regions of the device and not in others. Still another object of the present invention is to provide a variety of SOI devices in which floating body effects can be minimized using fabrication principles. Yet another object of the present invention is to provide an SOI device that is easy to use and cost-effective to manufacture.

BRIEF SUMMARY OF THE INVENTION

A semiconductor device includes at least a first silicon oxide insulator (SOI) transistor and a second SOI transistor, and at least the first SOI transistor has a semiconductive body region. A semiconductive transition region is disposed between the first and second SOI transistors. The transition region has a first conductivity type and communicates with a power supply voltage source. In accordance with the present invention, the first conductivity type and the voltage source are selected to either isolate the first SOI transistor from the second transistor such that the body region of the first SOI transistor exhibits a floating effect, or to link the body region such that the body region does not exhibit a floating effect.

In the preferred embodiment, an ohmic connector connects the transition region to the voltage source. The transition region includes a relatively highly doped region and a relatively lightly doped region, and the ohmic connector contacts the relatively highly doped region. Per the present invention, the first transistor includes source and drain regions having the first conductivity type, and the transition region isolates the first SOI transistor from the second SOI transistor. In such an embodiment, the body of the first SOI transistor exhibits a floating effect. In contrast, when the first transistor includes source and drain regions having a second conductivity type opposite the first conductivity type, the transition region links the body region of the first SOI transistor with the voltage source such that the body of the first SOI transistor substantially does not exhibit a floating effect. When the source and drain regions are doped with an N-type dopant, the voltage source preferably is a transistor drain voltage source, and when the source and drain regions are doped with a P-type dopant, the voltage source preferably is a transistor source voltage source. Or, the power supply voltage source can output a variable voltage for establishing a biased metal oxide silicon (MOS) device.

Additionally, the first SOI transistor includes a gate, and the device can further includes a conductor interconnecting the gate and the transition region to establish a dynamic threshold metal oxide silicon (DTMOS) device. Alternatively, the first SOI transistor can include an emitter and a gate, and a conductor can interconnect the gate and the emitter to establish a lateral bipolar transistor. In such an embodiment, the gate has the first conductivity type.

In another aspect, a semiconductor SOI pinch resistor includes a silicon substrate and a silicon oxide insulator (SOI) layer on the substrate. At least one relatively lightly doped semiconductive region that has a first conductivity type is on the SOI layer. Also, at least first and second relatively highly doped semiconductive regions having the first conductivity type are disposed on the relatively lightly doped semiconductive region. Additionally, at least one field oxide layer is disposed between the first and second relatively highly doped semiconductive regions, and at least first and second ohmic connectors are respectively in contact with the first and second relatively highly doped semiconductive regions.

In still another aspect, a semiconductor SOI diode includes a silicon substrate and a silicon oxide insulator (SOI) layer on the substrate. At least one relatively lightly doped semiconductive region having a first conductivity type is disposed on the SOI layer, and at least first and second relatively highly doped semiconductive regions having respective first and second conductivity types are disposed on the relatively lightly doped semiconductive region. The first and second conductivity types are opposite of each other. At least first and second ohmic connectors are respectively in contact with the first and second relatively highly doped semiconductive regions.

In yet another aspect, a method is disclosed for making a silicon oxide insulator (SOI) device. The method includes disposing at least one SOI layer on at least one silicon substrate, and supporting at least one body region on the SOI layer, with the body region being characterized by a first conductivity type. Also, the method includes juxtaposing at least source and drain regions with the body region, the source and drain regions being characterized by a second conductivity type. At least one transition region is disposed near the body region above the SOI layer, and the transition region is characterized by a transition conductivity type. As disclosed in detail below, the transition conductivity type is established to be the first conductivity type for suppressing floating body effects in the body region. On the other hand, the transition conductivity type is established to be the second conductivity type for isolating the body region.

In still another aspect, a silicon oxide insulator (SOI) device includes at least one SOI layer and at least one silicon substrate supporting the SOI layer. At least one body region is disposed on the SOI layer, the body region being characterized by a first conductivity type. Moreover, at least source and drain regions are juxtaposed with the body region, the source and drain regions being characterized by a second conductivity type. At least one transition region is disposed near the body region above the SOI layer, with the transition region being characterized by a transition conductivity type. Per principles discussed further below, the transition conductivity type is established to be the first conductivity type for suppressing floating body effects in the body region, and is established to be the second conductivity type for isolating the body region.

Other features of the present invention are disclosed or apparent in the section entitled: "DETAILED DESCRIPTION OF THE INVENTION".

BRIEF DESCRIPTION OF DRAWINGS

For a fuller understanding of the present invention, reference is made to the accompanying drawings in the following detailed description of the Best Mode of Carrying Out the Present Invention. In the drawings, metal elements are shown generally with cross-hatching and semiconductive elements, with the exception of elevational views of gate regions, generally are not shown with cross-hatching, and.

Reference numbers refer to the same or equivalent parts of the present invention throughout the several figures.

DETAILED DESCRIPTION OF THE INVENTION

Figure 1:
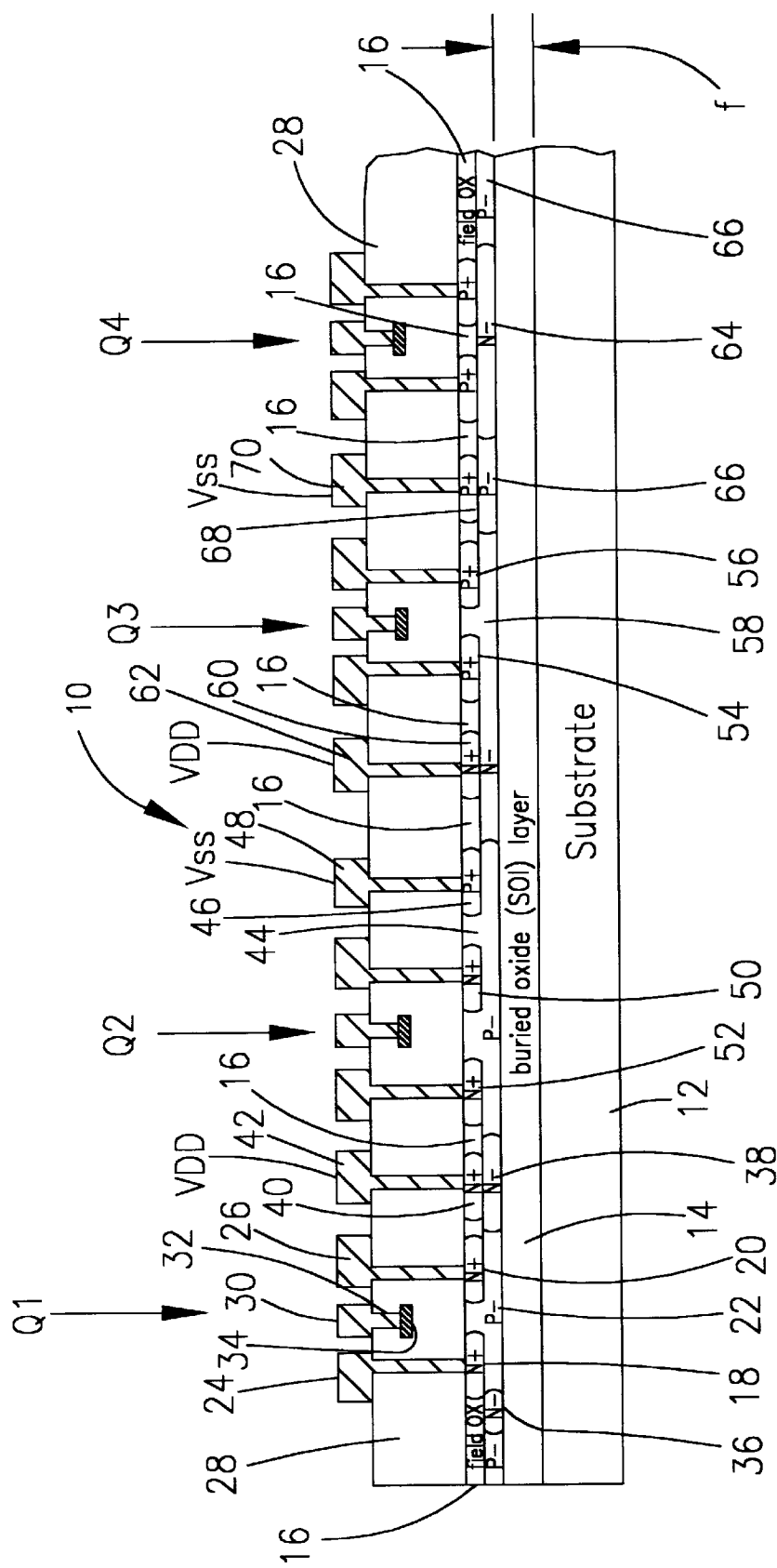
FIG. 1 is a schematic elevational view of an SOI device including four transistors.
Figure 2:
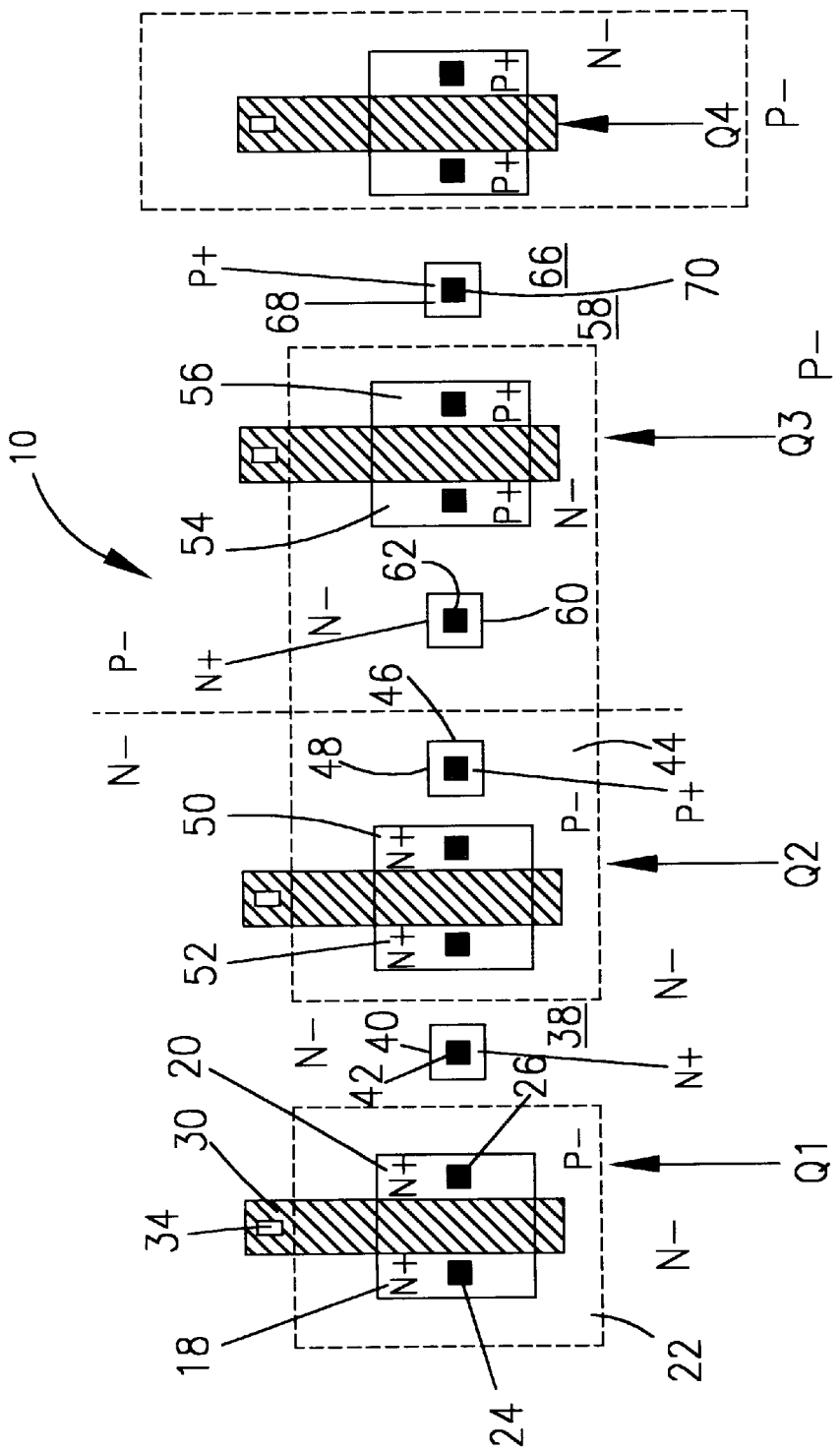
FIG. 2 is a schematic plan view of the device shown in FIG. 1, with portions broken away.

Referring initially to FIGS. 1 and 2, a silicon oxide insulator (SOI) device is shown, generally designated 10. As best shown in FIG. 1, the SOI device 10 includes a silicon substrate 12 that supports a silicon oxide insulator (SOI) layer 14, also referred to as a "buried oxide" layer. In accordance with SOI principles, the SOI layer 14 can have a thickness "t" of between five hundred Angstroms and four thousand Angstroms (500 Å–4000 Å). In the preferred embodiment, the silicon substrate 12 has been lightly doped with a P$^-$ conductivity dopant to about fifty ohm centimeters (50 Ω-cm).

A field oxide layer 16 is disposed on the SOI layer 12, and various regions that can be doped with dopants having predetermined conductivity types are also supported on the SOI layer 14 and can be established by partial oxidation of the field oxide layer 16. In the exemplary embodiment shown, an N-channel source region 18 and an N-channel drain region 20 have been doped with N$^+$ conductivity type dopants, it being understood that the indicator "+" in the Figures indicates relatively strong doping and the indicator "−" in the Figures indicates relatively weak doping. Also, an N-channel body region 22 has been disposed between and below the source and drain regions 18, 20 and has been doped with a P$^-$ dopant.

To connect the source region 18 and drain region 20 to circuit elements external to the device 10, a metal N-channel source electrode 24 is connected to the source region 18 and a metal N-channel drain electrode 26 is connected to the drain region 20, with the horizontally-oriented portions of the electrodes 24, 26 being distanced from the field oxide layer 16 by an intermediate oxide layer 28. On the other hand, a metal N-channel gate electrode 30 includes a contact 32 that extends toward the N-channel body region 22, the end of which abuts a polysilicon N-channel control gate 34. The above-described structure establishes an N channel isolated transistor circuit element, hereinafter referred to as "Q1".

In accordance with the present invention, the body 22 of the N channel isolated transistor Q1 is isolated from the voltages in selected other circuit elements shown in FIGS. 1 and 2 by transition regions. When the body of the transistor of the present invention is to be isolated as is the case with the body 22 of the N channel transistor Q1, the transition regions are N-junction isolation regions 36, 38 that respectively bound the left and right sides (FIG. 1) of the body region 22 and that extend down to the SOI layer 14.

Per the present invention, the isolation regions 36, 38 are relatively lightly doped with a conductivity dopant that is the opposite from that of the body 22. Thus, because the transistor Q1 is an N channel transistor, the isolation regions 36, 38 are doped with an N– dopant as shown in FIGS. 1 and 2. In one presently preferred embodiment, the isolation regions 36, 38 are doped to between about $10^{14}$ atoms per cubic centimeter to $10^{18}$ atoms per cubic centimeter, and more preferably are doped to about $10^{16}$ atoms per cubic centimeter to $10^{18}$ atoms per cubic centimeter.

Furthermore, the right isolation region 38 includes a relatively highly doped (e.g., between about $10^{19}$ to $10^{21}$ atoms per cubic centimeter) connection region 40. As shown in FIGS. 1 and 2, the connection region 40 is doped with the same conductivity dopant as the isolation region 38. Also, the connection region 40 advantageously is connected to an ohmic connector, such as an isolation electrode 42 or a polysilicon connector, which in turn is connected to a power supply voltage. When the connection region 40 is doped with an N-type dopant, the isolation electrode 42 preferably is connected to a power supply voltage $V_{DD}$ for the drain power supply of the transistor Q1. It is to be understood that the principles above apply for the opposite type dopant in the case of isolated P channel transistors, such as the transistor Q4 discussed below, with the power supply voltage in such a circumstance preferably being the source power supply voltage $V_{SS}$. It is to be further understood that the body regions of linked transistors may be biased above or below $V_{SS}/V_{DD}$ as appropriate, or may be hardwired to a fixed potential as described above, or may be selectively biased with circuitry, e.g., at $V_{DD}$+0.5 volts for standby operation and $V_{DD}$–1.0 volts for active operation.

With the above disclosure in mind, it is to be understood that the body region 22 is isolated by the transition (isolation) regions 36, 38. Although the body region 22 might exhibit floating body principles, as understood by the present invention isolating the body 22 as shown can render the N channel isolated transistor Q1 useful for, e.g., very low voltage (under two volts) applications, for example, in certain SRAM applications.

In any event, in continued reference to FIGS. 1 and 2, the use of ohmic connectors with transition regions gives the circuit designed the option to selectively isolate the body of an SOI transistor (e.g., the N channel isolated transistor Q1) from other circuit elements, such as a second transistor (e.g., an N channel linked transistor Q2) such that the body region of the first SOI transistor exhibits a floating effect as described above. Or, the use of ohmic connectors with transition regions gives the circuit designed the option to link the body region of a transistor such that the body region does not exhibit a floating effect as described below. More particularly, now referring to the N channel linked transistor Q2 shown in FIGS. 1 and 2, the transistor Q2 has a body region 44 doped with a P– dopant, and the body region 44 is linked via an N+ contact region 46 to an external power supply via a contact 48. In the broad sense of the present invention, the contact region 46 is a transition region.

As mentioned above, when the transistor Q2 is an N channel transistor (i.e., a transistor having a P-type doped body 44 and N+ doped drain and source regions 50, 52) that is to be linked to an external voltage source, the contact 48 is preferably connected to the power supply voltage for the source $V_{SS}$ of the transistor. Alternatively, the contact 48 can be connected to a variable voltage source such that the transition link region 46 can establish a control terminal for, e.g., a voltage controlled oscillator (VCO) in a phase locked circuit. Thus, unlike the floating body of the transistor Q1, the body of the transistor Q2 is ohmically connected to a voltage reference, thereby eliminating or mitigating the sometimes undesirable "floating body effect" normally attributed to SOI technologies.

FIGS. 1 and 2 show a P channel linked transistor Q3 that is the inverse of the N channel linked transistor Q2. More specifically, the P channel linked transistor Q3 includes P+ doped source and drain regions 54, 56 and an N– body region 58, and the body region 58 is linked to an external power supply voltage by a P+ doped transition region 60 and a contact 62 in contact therewith. In turn, the contact 62 is in contact with a power supply voltage, preferably the drain voltage $V_{DD}$, to link the body 58 of the P channel linked transistor Q3 to the power supply voltage. Thereby, floating body effects in the transistor Q3 are substantially suppressed.

Additionally, a P channel isolated transistor Q4 can be provided that is the inverse of the N channel isolated transistor Q1, in that the N– doped body 64 of the P channel isolated transistor Q4 is isolated from external voltages. Specifically, the transistor Q4 includes a transition region that is a P-doped isolation region 66 which includes a relatively highly doped P+ connection region 68. The connection region 68 is connected to a contact 70 which in turn is connected to a power supply voltage $V_{DD}$ for the drain power supply of the transistor Q4.

The above structures may be fabricated using two masks, one for the N– field and one for the P– field. Or, a self aligned approach may be used that uses other alternatives such as silicon nitride as a hard mask for effecting field implant regions corresponding to the N or P transition regions discussed above, then removing the silicon nitride mask and effecting the remaining implants for P or N transition regions.

While the above disclosure focusses on tying transition regions to constant voltage power supply voltage sources, the present invention also recognizes that transition regions in SOI floating bodies can be connected to variable voltage sources, if desired. For example, to reduce power consumption in a mobile telephone integrated circuit, the circuit can be selectively deenergized, with the off current of the transistors in the circuit being further reduced by applying a negative voltage to transition regions in N channel body regions and a positive voltage to transition regions in P channel body regions, thereby reducing subthreshold leakage current. Analog circuits similarly can be enhanced to obtain lower leakage current. Moreover, such circuits can also be grounded or forward biased by applying voltages to transition regions for functions such as current mirrors or current sources.

Figure 3:
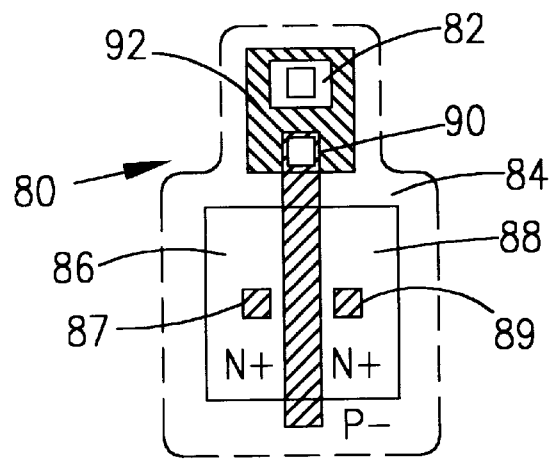
FIG. 3 is a schematic plan view of an SOI DTMOS of the present invention.

FIG. 3 shows an SOI N-channel dynamic threshold metal oxide silicon (DTMOS) transistor 80 that includes a P+ transition region 82 disposed in a P− body region 84. The DTMOS 80 also includes an N+ source region 86 with electrode 87, an N+ drain region 88 with electrode 89, and a gate 90. As shown, an ohmic connector, such as a metal electrode 92, interconnects the gate 90 and the transition region 82 to establish the DTMOS 80. It is to be understood that a P-channel DTMOS can be constructed using the above principles by reversing the dopant types.

Figure 4:
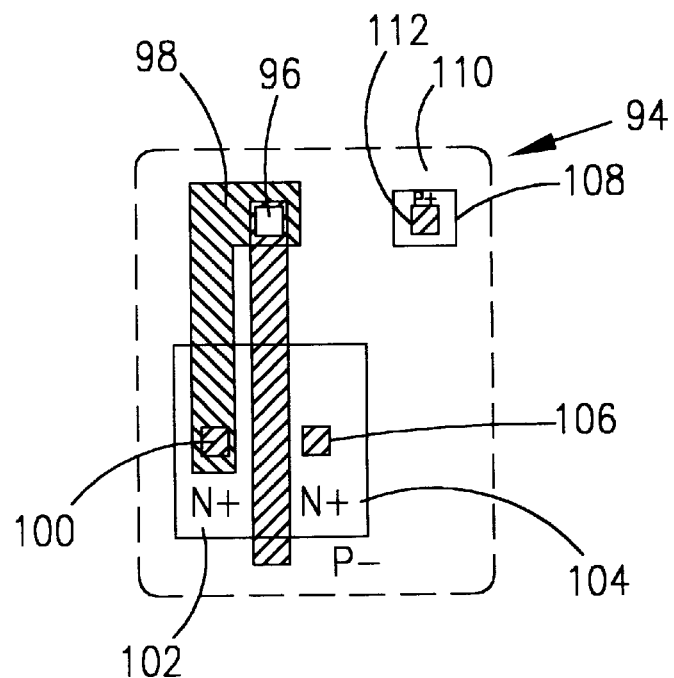
FIG. 4 is a schematic plan view of an SOI NPN bipolar transistor of the present invention.

Now referring to FIG. 4, it may be appreciated that the present transition region with ohmic connector can be used to implement an SOI NPN bipolar transistor 94 that is useful for band-gap reference applications, current mirror applications, and other analog circuit applications. As shown in FIG. 4, the bipolar transistor 94 includes a base (gate) 96 that is connected via an ohmic connector 98 to the electrode 100 of an N+ emitter 102. Alternativily, the base (gate) 96 can be connected to a separate fixed or variable voltage source (not shown). The bipolar transistor 94 also includes an N+ collector 104 with electrode 106.

In the embodiment shown in FIG. 4, the transition region is a P+ doped transition region 108 that is disposed in a P− doped base region 110. An ohmic connector 112 interconnects the transition region 108 with an external voltage source. With this structure, the N+ source of an N channel transistor is rendered into an N+ emitter of a bipolar transistor, while the N+ drain of an N channel transistor is rendered into an N+ collector of a bipolar transistor. If desired, beta ($H_{FE}$) of the bipolar transistor 94 may have various base (gate) dimensions, and may be electrically varied by varying the base (gate) voltage. Like the other exemplary embodiments shown herein, the device shown in FIG. 4 can be rendered as its opposite or inverse, i.e., as a PNP bipolar transistor, by reversing the dopant types disclosed above.

Figure 5:
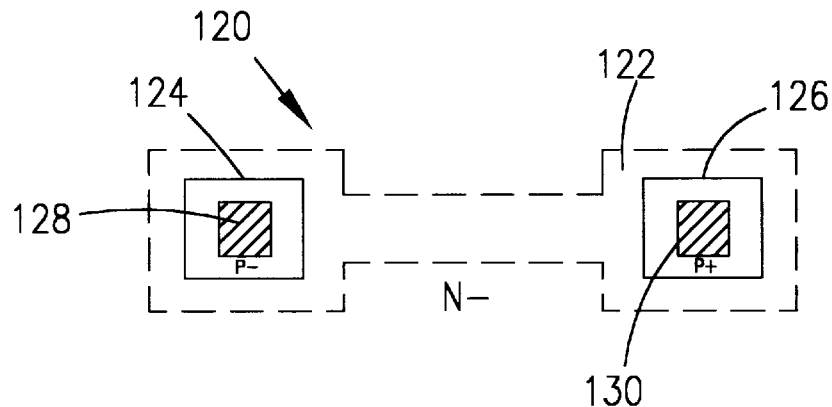
FIG. 5 is a schematic plan view of a passive SOI element.
Figure 6:
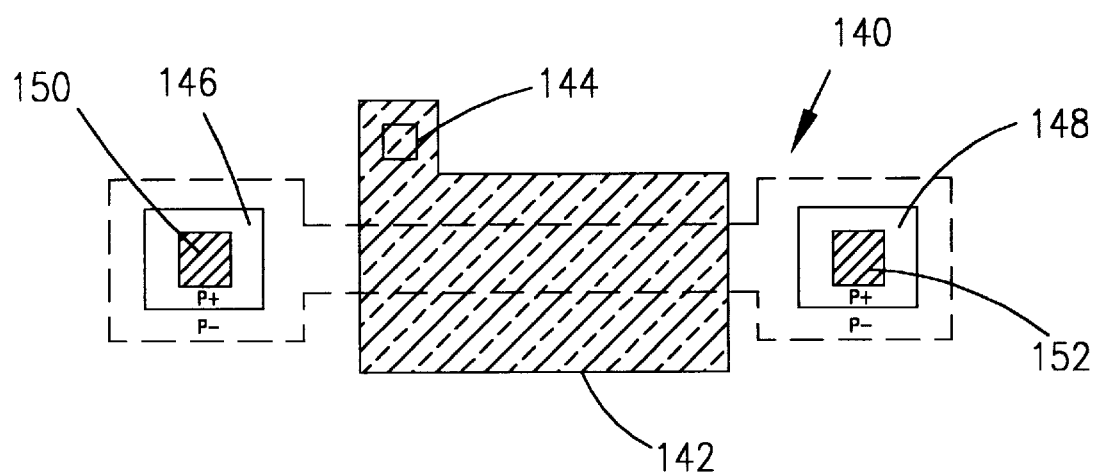
FIG. 6 is a schematic plan view of a passive SOI pinch resistor.
Figure 7:
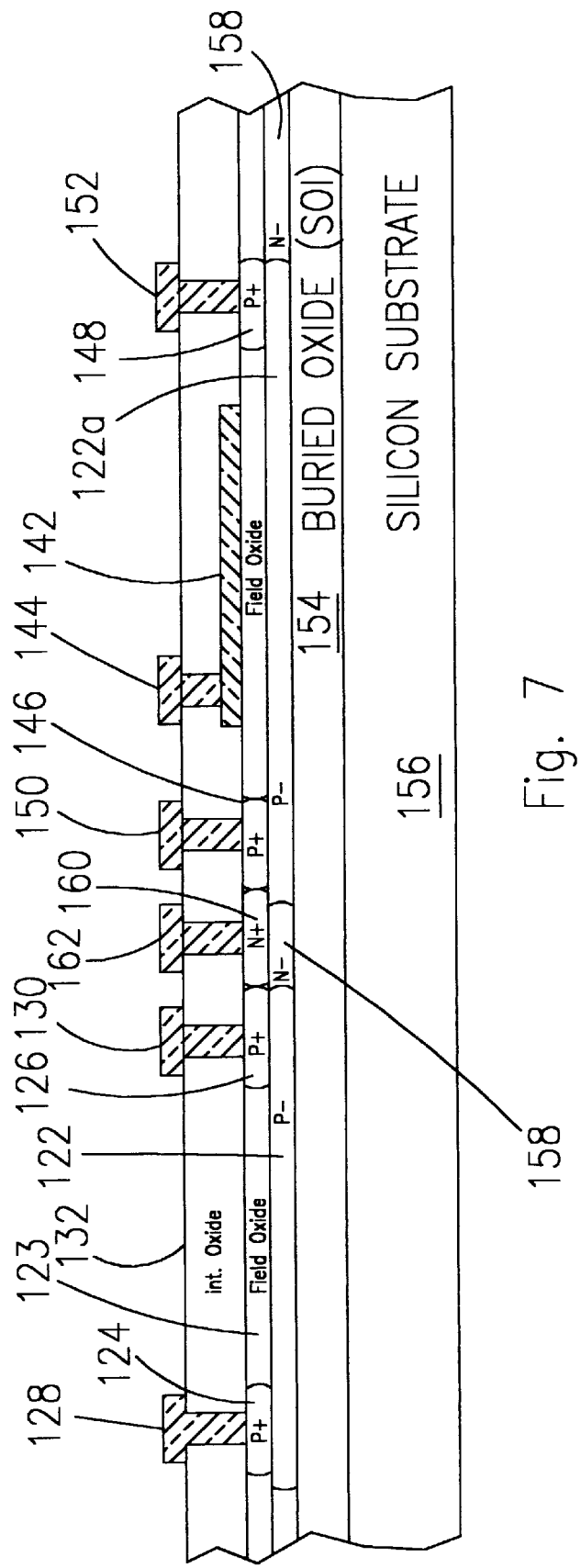
FIG. 7 is a schematic elevational view of the SOI pinch resistors shown in FIGS. 5 and 6.

FIGS. 5–7 show that the present principles can be applied to passive circuit elements such as pinch resistors for very high resistance applications. FIGS. 5–7 show P-type pinch resistors, although it is to be understood that N-type pinch resistors can be rendered using the principles disclosed herein by reversing the dopant types.

As shown in FIGS. 5 and 7, an SOI pinch resistor, generally designated 120, includes a P− field region 122 below a field oxide region 123 and two P+ transition regions 124, 126 disposed therein and spaced from each other. A respective ohmic connector 128, 130, preferably made of a conductive material such as a metal or polysilicon, extends through an intermediate oxide layer 132 and connects each transition region 124, 126 to external circuitry.

FIGS. 6 and 7 show a pinch resistor 140 that is in all essential respects identical to the pinch resistor 120 shown in FIGS. 5 and 7, with the exception that a polysilicon field electrode 142 is disposed in the intermediate oxide layer 132 above the field oxide layer 123 and is connected to an external voltage source by a polysilicon ohmic pinch connector 144. The field electrode 142 extends between two P+ transition regions 146, 148 (with respective ohmic connectors 150, 152) that are disposed in a portion 122a of the P− field 122 that is below the field electrode 142. As shown, the P− fields 122, 122a are disposed on an SOI layer 154, which in turn is supported on a bulk silicon substrate 156.

As recognized by the present invention, the field electrode 142 with pinch connector 144 can be used to modulate the conductivity of the P− field region 122a. More specifically, the resistance of the P− region 122a can be increased by biasing the field electrode 142 with a negative voltage, whereas the resistance of the P− region 122a can be decreased by biasing the field electrode 142 with a positive or negative voltage. Some of the applications of the pinch resistors 120, 140, which include analog circuitry applications and resistive static RAM loads, are discussed further below.

An N− isolation region 158 vertically extends between the field oxide layer 122 and the SOI layer 154 and laterally between the resistors 120, 140 to isolate the resistors 120, 140. Per present principles, the N− isolation region 158 includes an N+ contact region 160, and an ohmic connector 162 interconnects the contact region 160 with a voltage, e.g., $V_{DD}$. The P− region 122 can be doped to, e.g., from ten thousand Ohms per unit area to one million Ohms per unit area.

Figure 8:
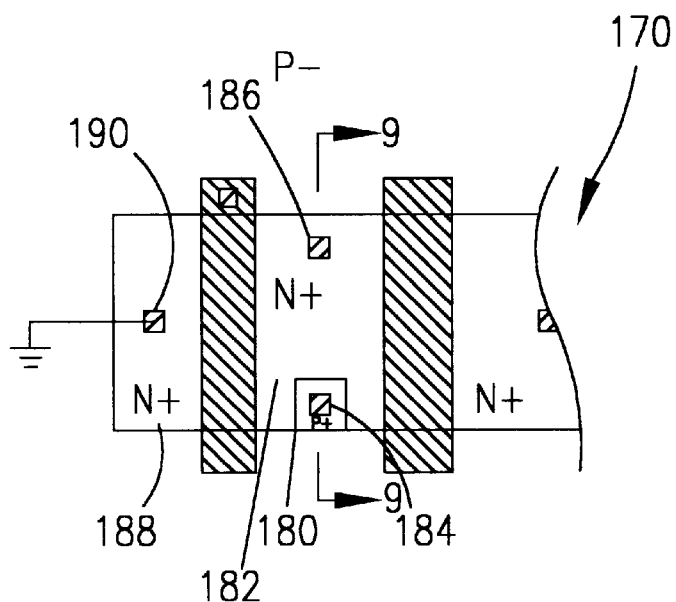
FIG. 8 is a schematic plan view of one half of an SOI diode for static random access memory (SRAM) applications.
Figure 9:
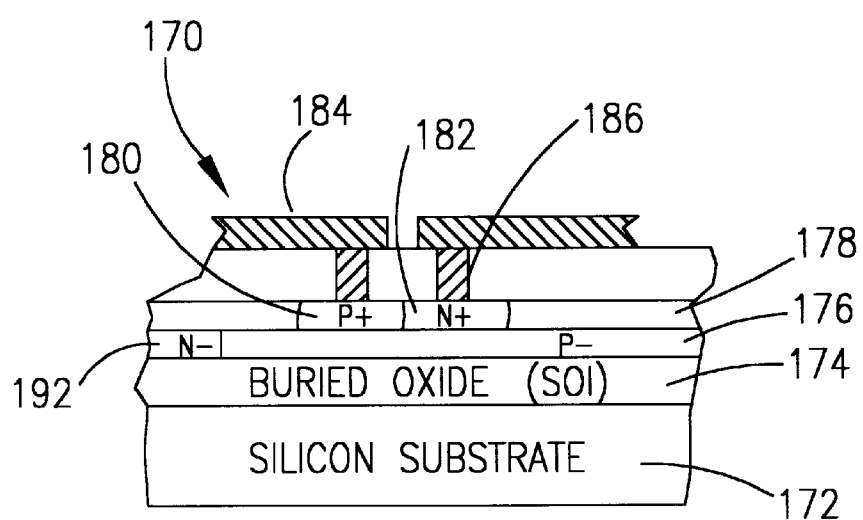
FIG. 9 is a schematic elevational view of the SOI diode shown in FIG. 8, as indicated by the line 9—9 shown in FIG. 8.

FIGS. 8 and 9 show an SOI PN diode of the present invention, generally designated 170. As shown in FIG. 9, the diode 170 includes a silicon bulk substrate 172 that supports an SOI layer 174. A P− body region 176 is disposed on the SOI layer 176, and a field oxide layer 178 is disposed on the body region 176. Adjacent to the field oxide layer 178 are contiguous P+ and N+ diode regions as shown 180, 182. Each diode region 180, 182 is contacted by a respective ohmic connector 184, 186 for connecting a voltage source or other circuit element to the respective diode region 180, 182. In the case of the P+ diode region 180, the ohmic connector 184 may be connected to $V_{DD}$ or may be connected to a circuit signal node An N+ transition region 188 can be connected via an ohmic connector 190 to ground or alternatively to a voltage source. Junction isolation region 192 is an N− doped region that isolates the body region 176 from other integrated circuit devices and structures (not shown).

With the above structure, the high reverse diode leakage of the P+/N+ diode facilitates its use as an SRAM cell load, providing that the associated N channel transistor off state current is much less than the diode leakage current.

Figure 10:
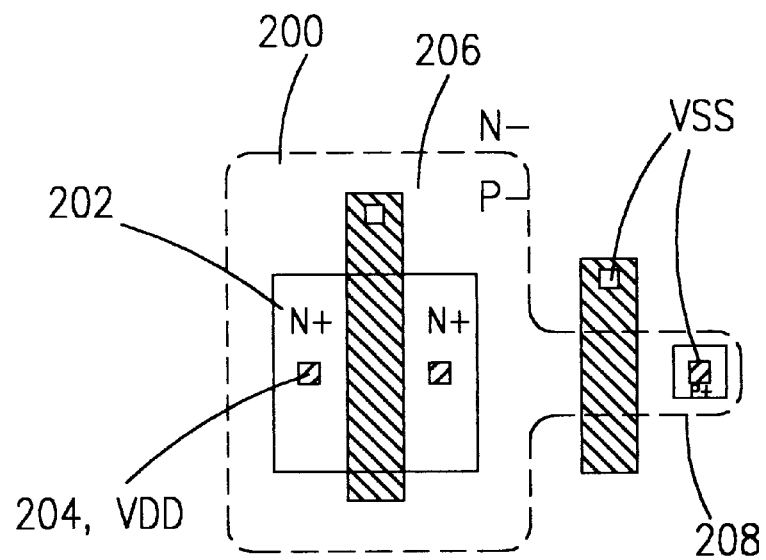
FIG. 10 shows an N channel high resistance body tie using a pinch resistor.
Figure 11:
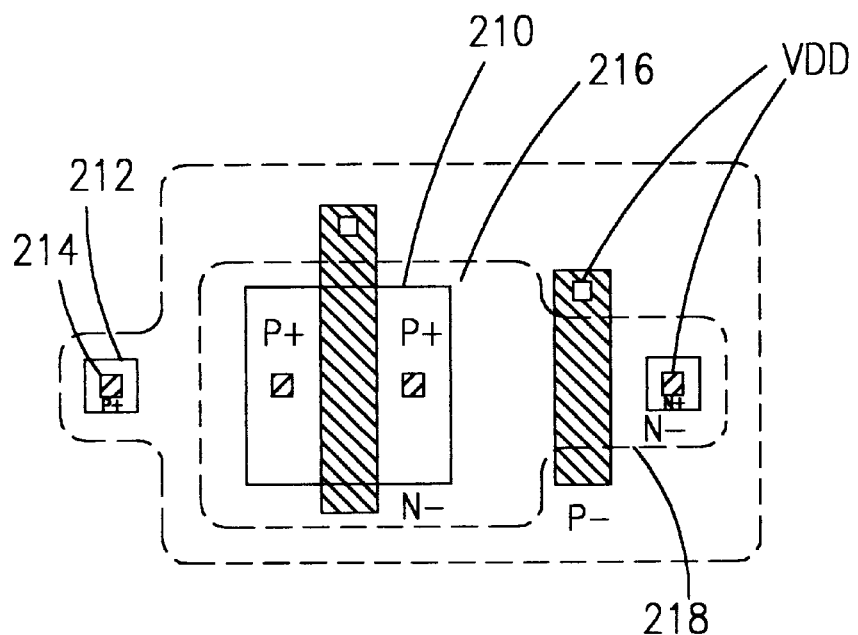
FIG. 11 shows a P channel high resistance body tie using a pinch resistor.

FIGS. 10 and 11 show high resistance body ties using pinch resistors. In FIG. 10, an N channel transistor 200 is isolated by an N+ transition region 202 with ohmic connector 204, preferably connected to $V_{DD}$. Also, the P− body 206 of the N channel transistor 200 is tied to $V_{SS}$ using a pinch resistor 208 which shares the body region.

Similarly, FIG. 11 shows a P channel transistor 210 is isolated by a P+ transition region 212 with ohmic connector 214, preferably connected to $V_{SS}$. Also, the N− body 216 of the P channel transistor 210 is tied to $V_{DD}$ using a pinch resistor 218.

The devices shown in FIGS. 10 and 11 are hybrid floating body SOI devices with the average dc bias set by means of the pinch resistors 208, 218 to $V_{SS}$, $V_{DD}$ (or other preferred voltage) as shown. With relatively large gate to channel capacitive coupling, however, the body will be dynamically biased by signal transients, thereby reducing the body bias coefficient (referred to in the art by the Greek letter ζ). Consequently, gain, dynamic $ID_{SAT}$, and dynamic $I_D$ off are improved. This is particularly beneficial at low operating voltages. Moreover, circuit simulators render accurate predictions when modelling the devices shown in FIGS. 10 and 11 because average body voltage bias is precisely known. In turn, circuit design time is significantly shortened. The pinch resistor body bias ac-decouples the bias reference voltage; consequently, circuit speed of the hybrid devices shown in FIGS. 10 and 11 will be about the same as the speed of floating body devices. One pinch resistor can be used to bias many sets of transistors.

Figure 12:
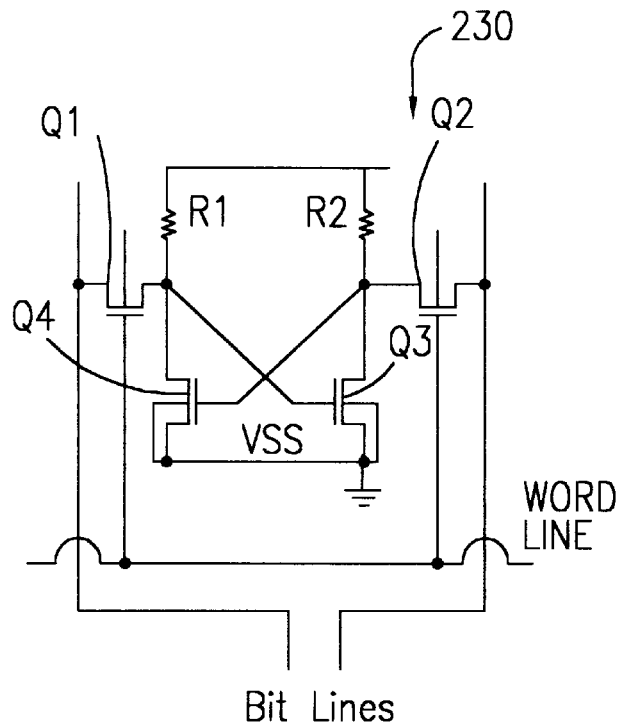
FIG. 12 is a circuit diagram showing an example circuit that uses the present SOI pinch resistors.
Figure 13:
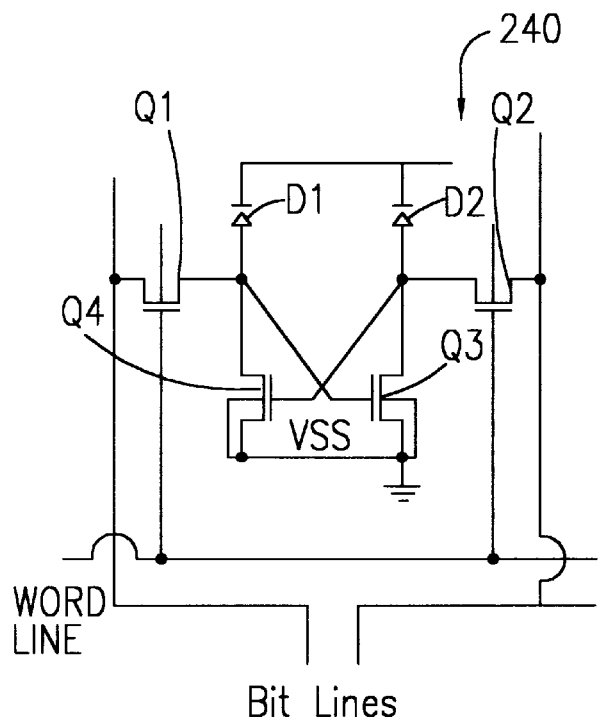
FIG. 13 is a circuit diagram showing an example circuit that uses the present SOI diodes.
Figure 14:
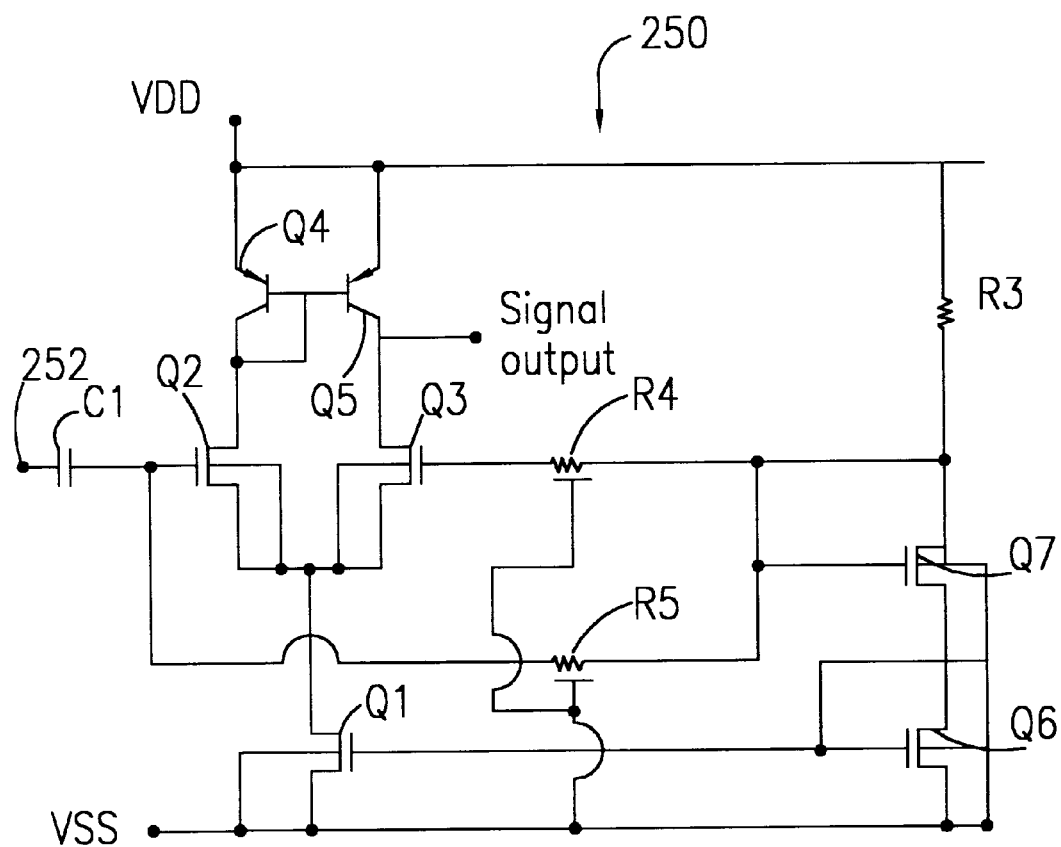
FIG. 14 is a circuit diagram showing an example analog differential amplifier circuit using SOI components of the present invention.

FIGS. 12–14 show various circuit implementations of the devices disclosed above. In FIG. 12, a circuit, generally designated 230, can be used as an SRAM cell. As shown, the circuit 230 includes pinch resistors R1 and R2 which can be one of the pinch resistors 120, 140 shown in FIGS. 5–7. The pinch resistors R1, R2 are tied at one end to $V_{DD}$ and are in series with floating body SOI transistors Q1, Q2, respectively and linked body transistors Q3, Q4, respectively. Each of the floating body transistors Q1 and Q2 shown in FIG. 12 can be established by the N channel floating body transistor Q1 shown in FIGS. 1 and 2. On the other hand, the transistors Q3 and Q4 in FIG. 12 are linked body SOI transistors, such as the N channel linked body transistor Q2 shown in FIGS. 1 and 2. It is to be understood that a circuit using P channel components can be used. The gates of the floating body transistors Q1, Q2 are connected to the word line of the SRAM load circuit shown, and one of the source/drain regions of the floating body transistors Q1, Q2 is connected to the bit lines.

FIG. 13 similarly shows an SRAM load circuit, generally designated 240, in which diodes D1 and D2, such as the diode 170 shown in FIG. 9, have been substituted for the pinch resistors shown in FIG. 12. The diodes D1, D2 are tied at one end to $V_{DD}$ and are in series with floating body SOI transistors Q1, Q2, respectively and linked body transistors Q3, Q4, respectively. Each of the floating body transistors Q1 and Q2 shown in FIG. 13 can be established by the N channel floating body transistor Q1 shown in FIGS. 1 and 2. On the other hand, the transistors Q3 and Q4 in FIG. 13 are linked body SOI transistors, such as the N channel linked body transistor Q2 shown in FIGS. 1 and 2. It is to be understood that a circuit using P channel components can be used. The gates of the floating body transistors Q1, Q2 are connected to the word line of the SRAM load circuit shown, and one of the source/drain regions of the floating body transistors Q1, Q2 is connected to the bit lines.

Turning now to FIG. 14, an analog differential amplifier circuit 250 is coupled to a signal node 252 via a capacitor C1. As shown, the circuit 252 includes SOI PNP bipolar transistors Q4, Q5. Each of the transistors Q4, Q5 shown in FIG. 14 can be established by a PNP bipolar transistor that is the inverse to the NPN transistor 94 shown in FIG. 4. Further, the circuit 250 shown in FIG. 14 includes SOI N channel transistors Q2 and Q3 with body ties at their own common source (instead of $V_{SS}$), with the transistors Q2, Q3 being respectively connected to the bipolar transistors Q4, Q5. Also, an N channel linked body transistor Q1 is connected to the floating body transistors Q2, Q3. Per present principles, the N channel linked and biased body transistors in the circuit 250 shown in FIG. 14 can be type Q2 transistors shown in FIGS. 1 and 2. Also, the N channel linked body transistors in the circuit 250 shown in FIG. 14 can be type Q2 transistors shown in FIGS. 1 and 2, with the following exception. The N channel linked body transistors in the circuit 250 shown in FIG. 14 have their bodies tied to $V_{SS}$. If, for some particular circuit consideration, any of the transistors would perform better with a floating body, then the Q1 N channel or Q4 P channel transistors shown in FIGS. 1 and 2 could be used without any wafer fabrication changes.

FIG. 14 shows that the gate of the N channel floating body transistor Q3 is connected to an SOI pinch resistor R4, preferably having a polysilicon field electrode. Accordingly, the pinch resistor R4 can be established by the pinch resistor 140 shown in FIG. 6. The polysilicon field electrode of the pinch resistor R4 in FIG. 14 is connected to a polysilicon field electrode of a second pinch resistor R5. Also connected to the pinch resistors R4, R5 are SOI N channel transistors Q6, Q7, the transistor Q6 being a linked body SOI transistor and the transistor Q7 being a biased linked body SOI transistor.

A pinch resistor R3 establishes the bias for the linked body transistors Q1, Q6, Q7. In accordance with the present invention, the linked body transistors Q1, Q6, and Q7 are current mirror transistors. The high resistance of the pinch resistor R3 permits establishing a low current bias for the linked body transistors Q1, Q6, and Q7 for low current differential applications. As recognized herein, existing N+ or P+ sheet resistances are too low in resistance values to be useful for the application shown in FIG. 14.

Likewise, the polysilicon field electrode pinch resistors R4 and R5 establish high resistance paths for biasing the control gates of biased linked body SOI transistors Q2, Q3, with the field electrodes improving the low pass time constant of the circuit 250. It is to be understood that the bodies of the SOI transistors shown in FIG. 14 are connected to voltages as described above to optimize low voltage operation of the circuit 250.

With the above disclosure in mind, it may now be appreciated that the principles disclosed herein extend circuit design flexibility and performance beyond previous approaches used in both SOI and bulk silicon fabrication processes. Additionally, the present principles can be applied to numerous other electronic device structures such as high voltage devices, e.g., drift field, field plated and graded junction MOSFETs and bipolar transistors. Still further, the present principles can be applied to high voltage diodes, and various capacitors and inductors to make these devices available to the circuit designer using linked body or floating body principles discussed herein. As recognized by the present invention, the flexibility provided by the invention disclosed herein enhances performance and reduces cost.

The present invention has been particularly shown and described with respect to certain preferred embodiments and features thereof. However, it should be readily apparent to those of ordinary skill in the art that various changes and modifications in form and detail may be made without departing from the spirit and scope of the inventions as set forth in the appended claims. The inventions illustratively disclosed herein may be practiced without any element which is not specifically disclosed herein. It is to be understood that the use of the singular in the claims to refer to an element means "at least one" element and not "only one" element, unless otherwise explicitly recited as "only one" element in the claims.

What is claimed is:

1. A method for making a plurality of silicon oxide insulator (SOI) devices, comprising the steps of:

disposing at least one SOI layer on at least one silicon substrate;

supporting a first body region on the SOI layer, the first body region being characterized by a first conductivity type;

juxtaposing at least source and drain regions with the first body region, the source and drain regions being characterized by a second conductivity type;

supporting a second body region on the SOI layer, the second body region being characterized by the first conductivity type;

disposing a transition region near the first body region and the second body region above the SOI layer, the transition region being characterized by a transition conductivity type, the transition conductivity type being established to be the first conductivity type for suppressing floating body effects in the first body region and the second body region by linking the first body region and the second body region;

supporting a third body region on the SOI layer;

supporting a fourth body region on the SOI layer; and disposing a second transition region near the third body region and the fourth body region above the SOI layer, wherein the third body region and the fourth body region have the same conductivity type, and the second transition region has a conductivity type which is opposite from the conductivity type of the third body region and the fourth body region so that the second transition region isolates the third body region from the second body region so that the third body region exhibits a floating effect.

2. The method of claim 1, further comprising the step of:

contacting the transition region with an ohmic connector.

3. The method of claim 2, further comprising the step of:

establishing a relatively highly doped region and a relatively lightly doped region in the transition region, wherein the ohmic connector contacts the relatively highly doped region.

4. The method of claim 2, further comprising the step of:

connecting the ohmic connector to a voltage source.

5. The method of claim 4, wherein the voltage source is established to be a transistor drain voltage source when the source and drain regions are doped with an N-type dopant, and wherein the voltage source is established to be a transistor source voltage source when the source and drain regions are doped with a P-type dopant.

6. The method of claim 1, wherein the step of disposing at least one transition region, comprises the step of self aligning a field implant to a field oxide over part of the substrate surface.

7. The method of claim 6, further comprising the step of forming a dynamic threshold metal oxide silicon transistor from the SOI device.

8. The method of claim 6, further comprising the step of forming a pinch resistor from the SOI device.

9. The method of claim 6, further comprising the step of forming bipolar NPN and PNP transistors from the SOI device.

10. The method of claim 6, further comprising the step of forming static random access memory from the SOI device.

11. The method of claim 1, further comprising the step of forming a dynamic threshold metal oxide silicon transistor from the SOI device.

12. The method of claim 1, further comprising the step of forming a pinch resistor from the SOI device.

13. The method of claim 1, further comprising the step of forming bipolar NPN and PNP transistors from the SOI device.

14. The method of claim 1, further comprising the step of forming static random access memory from the SOI device.

15. A method for making a silicon oxide insulator (SOI) device, comprising the steps of:

disposing at least one SOI layer on at least one silicon substrate;

supporting a plurality of body regions of a first conductivity type on the SOI layer;

juxtaposing a plurality of source and drain regions of a second conductivity type adjacent to the body regions;

disposing a plurality of transition regions between the plurality of body regions, wherein some of the body regions are linked through transition regions of the first conductivity type and some of the body regions are isolated by transition regions of the second conductivity type.

16. The method, as recited in claim 15, further comprising the step of connecting contacting each transition region with an ohmic connector.

17. The method, as recited in claim 16, further comprising the steps of establishing within each transition region a relatively highly doped region and a relatively lightly doped region, wherein the ohmic connector contacts the relatively highly doped region.

* * * * *